United States Patent [19]
Fujikawa et al.

[11] Patent Number: 5,698,029
[45] Date of Patent: Dec. 16, 1997

[54] VERTICAL FURNACE FOR THE GROWTH OF SINGLE CRYSTALS

[75] Inventors: Takao Fujikawa; Katsuhiro Uehara; Yoshihiko Sakashita, all of Takasago; Hiroshi Okada; Takao Kawanaka, both of Kobe, all of Japan

[73] Assignee: Kabushiki Kaisha Kobe Sekio Sho, Kobe, Japan

[21] Appl. No.: 659,013

[22] Filed: Jun. 4, 1996

[30] Foreign Application Priority Data

Jun. 6, 1995 [JP] Japan .................. HEI 7-139608
Feb. 8, 1996 [JP] Japan .................. HEI 8-22765

[51] Int. Cl.$^6$ ........................................... C30B 35/00
[52] U.S. Cl. ........................................ 117/204; 117/200
[58] Field of Search ............................. 117/81, 82, 83, 117/200, 204; 164/48, 122.1, 122.2

[56] References Cited

U.S. PATENT DOCUMENTS 5,603,763  2/1997  Taniguchi et al. .................. 117/81

FOREIGN PATENT DOCUMENTS 402196081A  8/1990  Japan .................. 117/81
403040987A  2/1991  Japan .................. 117/83
405097566A  4/1993  Japan .................. 117/83

*Primary Examiner*—Felisa Garrett
*Attorney, Agent, or Firm*—Oblon, Spivak, McClelland, Maier & Neustadt, P.C.

[57] ABSTRACT

A high-pressure container 1 as a furnace casing is equipped with insulating cylinder 2 of an inverted glass shape, and heater elements 18 individually mounted on heater mounting plates 16 arranged in parallel to section vertically the space for arranging the heater elements 18 at a given interval in the insulating cylinder 2.

For the procedures of single crystal growth by heating in a high-pressure gas atmosphere, the insulating cylinder 2 and the heater mounting plates 16 can suppress the effects of spontaneous convection of a high-pressure gas and the effects of the radiation heat from an adjacent heater element, as less as possible, so that the temperature controllability of each heating zone can be improved whereby the vertical temperature distribution in the furnace can be controlled appropriately. Also, a heater element 18 of a larger aperture size can be maintained at a stably supported state, whereby a single crystal of a larger dimension can be grown.

15 Claims, 9 Drawing Sheets

VERTICAL FURNACE FOR THE GROWTH OF SINGLE CRYSTALS

BACKGROUND OF THE INVENTION

The present invention relates to a vertical furnace for the growth of single crystals under pressure and suitable for the growth of the single crystals of the II-VI compounds semiconductors, such as ZnSe, CdTe and ZnS, or the III-V compounds semiconductors such as InP, GaP and GaAs.

For the growth of single crystals of the II-VI compounds semiconductors or the III-V compounds semiconductors, use has been made of the liquid encapsulated Czochralski process, the horizontal Bridgman process, the vertical Bridgman process, the vertical temperature gradient freezing process and the like.

Figure 6:
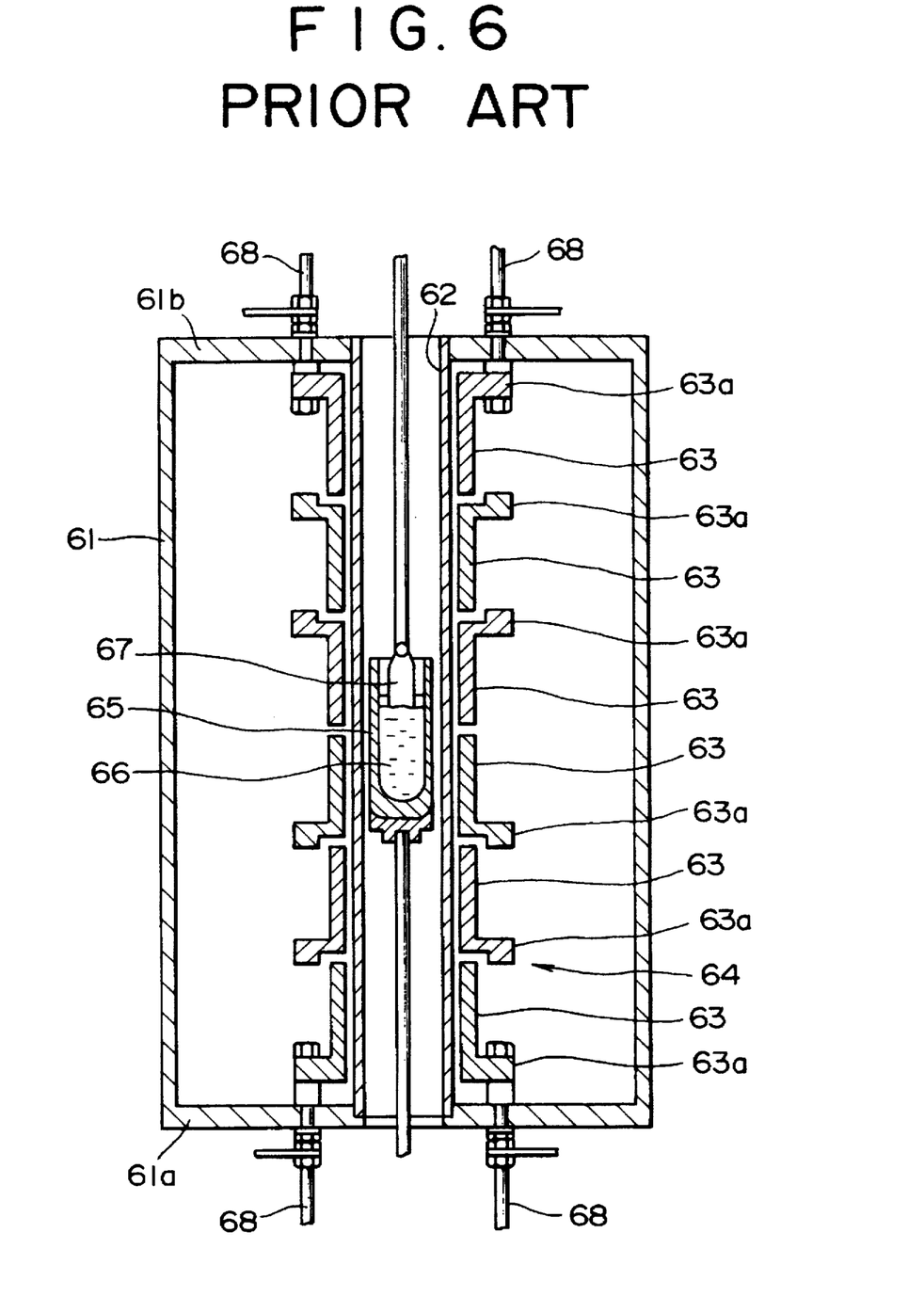
FIG. 6 is a schematic longitudinal view depicting the structure of the conventional furnace for the growth of single crystals.

Japanese Patent Laid-open No. Sho 63-174293 discloses one example of the Czochralski process, wherein core tube 62 is arranged at and vertically passes through the central part of furnace casing 61, as shown in FIG. 6. On the periphery of the core tube 62 is arranged heating furnace 64 equipped with six heater elements 63 comprising a resistance heater made of graphite. By individually regulating the supply capability to each heater element 63, thereby forming a heated region at a given temperature distribution in the axial direction of the core tube 62 to heat raw material 66 for crystal growth in crucible 65 placed in the heated region, a process of growing single crystal 67 from the melt solution of the raw material is initiated then.

Figure 7:
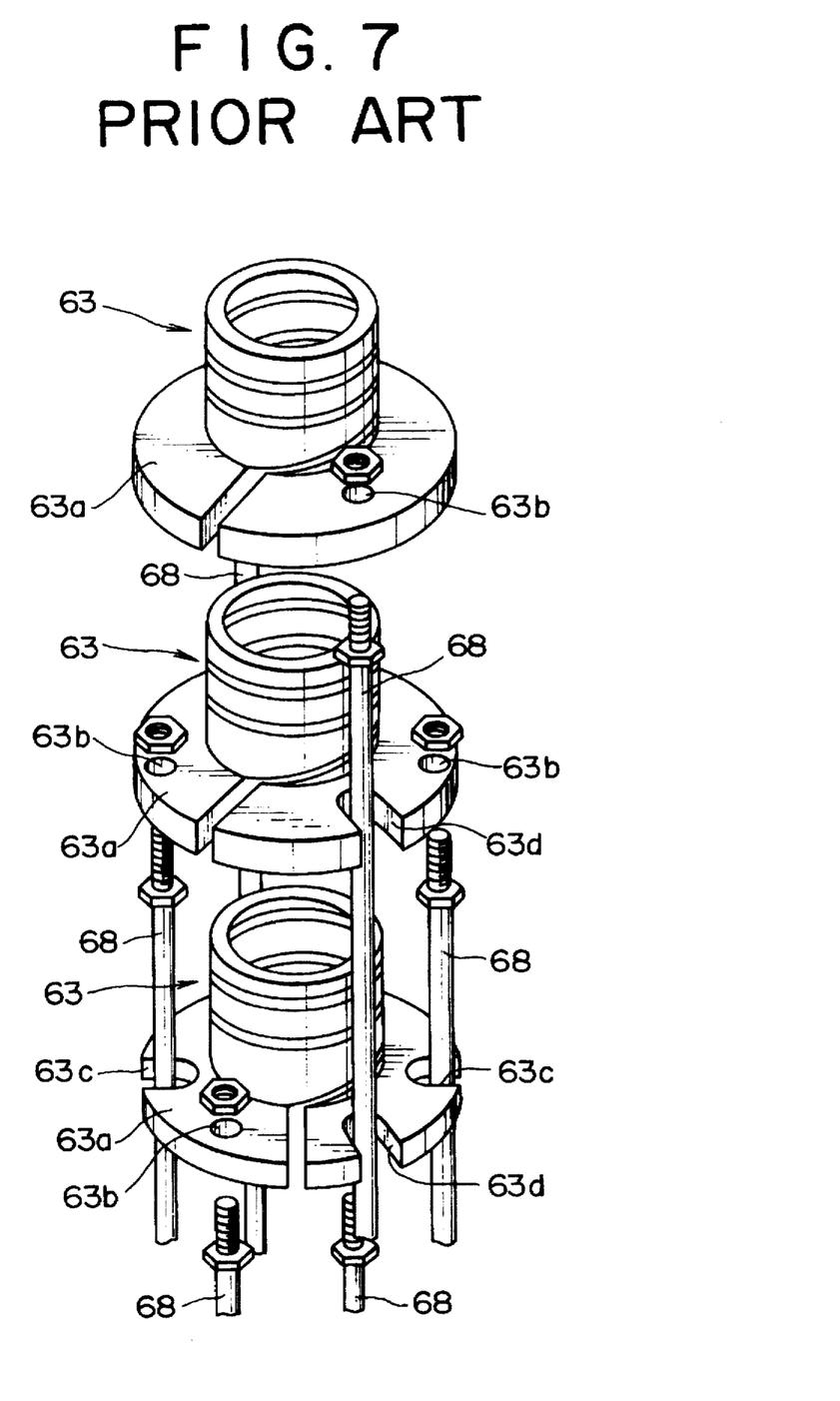
FIG. 7 is a perspective view depicting the structure of the heating furnace of the production furnace of FIG. 6.

As shown in FIG. 7, the exothermic part of each of the heater elements 63 is formed in a cylindrical double-helix structure, and a pair of mounting holes 63b and two sets of notches 63c, 63d are arranged on the bottom cleat 63a of the lowest heater element 63. Then, the individual upper ends of bar-like lead electrodes 68, 68 extending from the bottom are fixed onto the mounting holes 63b, and electric power is supplied through these lead electrodes 68, 68. Simultaneously, the heater element 63 is supported with these lead electrodes 68, 68.

In a pair of mounting holes 63b, 63b formed on an identical bottom cleat 63a to the cleat described above on the second lower heater element 63 are fixed individual upper ends of lead electrodes 68, 68 passing through the notches 63c, 63c of the lowest heater element 63 and extending upwardly. Furthermore, in a pair of mounting holes 63b, 63b formed on an identical bottom cleat 63a to the cleat described above on the third lower heater element 63 are fixed individual upper ends of lead electrodes 68, 68 passing through the notches 63d, 63d of the second lower heater element 63 and extending upwardly.

As shown in FIG. 6, each of the lead electrodes 68, 68, passes in a sealing manner through furnace bottom 61a of the furnace casing 61 to be then drawn Outwardly. Herein, the three heater elements 63, 63, 63 on the upper half are in a structure wherein the above described structure is inverted vertically, and the lead electrodes 68, 68, pass in a sealing fashion through furnace top 61b of the furnace casing 61 to be then drawn outwardly.

The individual lead electrodes 68 described above are arranged in the same circumference, and by structuring the heater elements 63 to be supported with these lead electrodes 68 as shown above, the overall structure is simplified.

Among the various single crystal production methods described above, alternatively, the vertical Bridgman method (VB method) and the vertical temperature gradient freezing method (VGF method) can produce relatively large and high-quality single crystals with low dislocation density. Thus, greater expectation has been drawn toward the two methods as industrial methods.

In the furnaces according to the VGF method and the VB method as described above, a plurality of heater elements are arranged vertically. By adjusting the supply capability to these heater elements, such a temperature gradient should be prepared in a crucible containing a raw material that the upper portion of the crucible should be set to a temperature exceeding the melting point of the raw material, while the temperature should be gradually lowered below the melting point at a lower portion. By gradually cooling and solidifying the melt raw material in solution from the bottom, a single crystal may be grown. Therefore, it is significant to give an intended temperature distribution vertically. As described above, thus, a plurality of heater elements independently controllable of their supply capability are vertically arranged.

For GaAs and ZnSe which components may be dissociated from each other during the single crystal growth, a high pressure inert gas is charged in a furnace casing so as to suppress the dissociation to carry out the procedures of single crystal growth.

For the aforementioned single crystal growth in an inactive high-pressure gas atmosphere, however, a desirable temperature distribution cannot readily be generated, disadvantageously, because of the significant effects of the spontaneous convection of a high-pressure gas in the furnace, even if the supply capability is adjusted by vertically arranging a great number of heater elements in parallel.

For one example, it is illustrated a structure where the same furnace as heating furnace 64 described in Japanese Patent Laid-open No. Sho 63-174293 is placed in a sealed furnace casing to be charged with a high-pressure gas, wherein the quantity of heat is conducted to the upper wall face of the furnace casing via the upper gas flow on spontaneous convection. The quantity of heat conducted to the furnace casing and dispersed therein is increased as the pressure of the gas charged in the furnace casing is increased, involving the increase of spontaneous convection. Thus, even if the heating zone of each of the heating elements should be controlled to a given temperature, the heat transfer between the zones via spontaneous convection is so elevated that it will be difficult to generate a given temperature distribution stably. When the supply capability to one heater element varies correspondingly to the variation from the given temperature to change the exothermic heat from the heater element, for example, the change affects an adjacent heater element, so that the supply capability to the adjacent heater element is changed. Through such interaction, the control cannot be done in a stable fashion, causing a temperature fluctuation.

When the temperature fluctuates near the melting point region during the single crystal growth, in particular, the interface for the single crystal growth fluctuates to cause the repetition of re-melting and re-solidification, whereby the number of crystal defects is increased too much.

From such respect, therefore, it is desirable that the temperature gradient near the melting point region should be as sharp as possible so as to decrease the fluctuation of the interface for the single crystal growth markedly as possible even if the temperature fluctuation occurs. However, it has been very difficult to form such a sharp temperature gradient and maintain the gradient in a stable fashion because of the greater interaction between adjacent heater elements in the structure of conventional heating furnaces. Thus, it has been quite difficult to generate a high-quality single crystal with a sufficiently reduced density of crystal defects.

Because individual heater elements are structurally supported with a pair of bar-like lead electrodes in a furnace of the same structure as that of the heating furnace 64 described in the Japanese Patent Laid-open, furthermore, such structure is not applicable to a larger heater element which cannot be stably supported with a pair of lead electrodes although the structure is applicable to a small type of a heater element of a diameter of several centimeters or less. Thus, only single crystals of a small dimension can be generated, disadvantageously.

SUMMARY OF THE INVENTION

In such circumstances of the aforementioned conventional problems, it is an object of the present invention to provide a vertical furnace for the growth of single crystals, which is able to control the vertical temperature distribution in a furnace under pressure accurately.

It is another object of the present invention to provide a vertical furnace for the growth of single crystals, which is able to grow a larger scale of single crystal and additionally able to efficiently grow compound crystals to be readily dissociated.

So as to attain the objects in accordance with the present invention preferably, a vertical furnace for the growth of single crystals comprises a sealed furnace casing having a gas supply and discharge path to be connected outwardly, a supporting member supporting a raw material charging container to charge a raw material for the growth of single crystals in the furnace casing, and (a plurality of) approximately cylindrical heater elements being vertically arranged in parallel in the furnace casing and for heating the periphery of the raw material charging container, wherein an insulating cylinder of an approximately inverted glass shape to enclose the entirety of the individual heater elements from the tops thereof is arranged in the furnace casing, and wherein (a plurality of) heater mounting plates in a ring shape are arranged in parallel at a given interval in a vertically separated space in which heater elements are arranged in the insulating cylinder, and on the individual heater mounting plates the heater elements are mounted, and wherein the lead electrodes vertically descending from the outer periphery of the individual heater elements in the insulating cylinder are independently connected to the power supply terminals mounted on the bottom wall of the furnace casing.

In the vertical furnace for the growth of single crystals in accordance with the present invention, preferably, an inactive gas is charged for example through the gas supply and discharge path into the furnace casing and the insulating cylinder is arranged inside the furnace casing even if heating is carried out in a high-pressure gas atmosphere. Therefore, the upward gas flow via spontaneous convection does not adhere to the wall face of the furnace casing, whereby the thermal dispersion from the inside of the insulating cylinder is suppressed whereby spontaneous convection is successively suppressed. Furthermore, the spontaneous convection between individual heater elements can be suppressed by means of the ring-like heater mounting plates mounting the individual heater elements; further, the heater mounting plates can shield the radiation heat from an adjacent heater element. Thus, the temperature controllability of the heating zone of each heater element can be improved. Because the individual heater elements are independently mounted on the heater mounting plates supported onto the bottom wall of the furnace casing, the heater elements can be supported and maintained at a stable state even if the elements are of a larger size.

A protecting tube for a thermocouple to detect the heating temperature of each heater element may pass vertically through an inner portion of the heater element on the heater mounting plate, to be then supported thereon.

By such structure, heater elements can be securely held on a given position without any occurrence of deflection on the upper free end of the protective tube.

A chamber comprising a airtight material to enclose the raw material charging container may be arranged at an inner portion of the heater mounting plates and the individual heater elements, and then, an air opening which communicates the inside and outside of the chamber together may be arranged on the bottom side of the chamber.

When a raw material to be heated in the raw material charging container inside the chamber is a readily dissociating substance, the vapor generated from the dissociation descends toward the lower air opening in the chamber. By the aforementioned structure, then, the vapor can be deposited on a portion of the air opening apart downhill from the heating region by keeping the portion at a state of a low temperature.

Other objects and effects of the present invention will be apparently shown in the following detailed description.

DESCRIPTION OF THE PREFERRED EMBODIMENTS

EXAMPLE 1

With references to FIGS. 1 and 2, description will now be made of a specific embodiment of the present invention.

Figure 1:
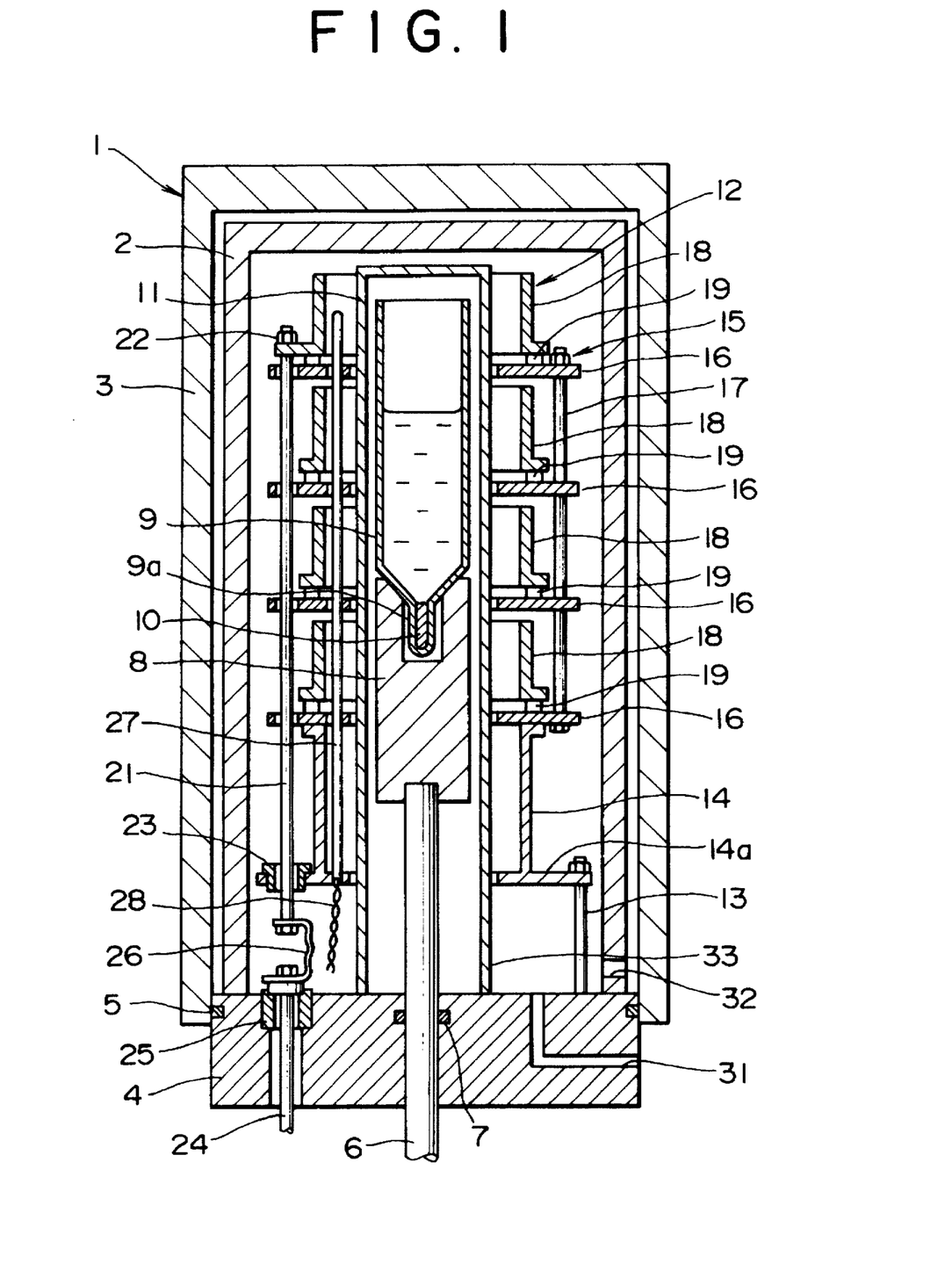
FIG. 1 is a schematic longitudinal view depicting the structure of a furnace for the growth of single crystals of one example of the present invention.

FIG. 1 depicts a furnace for the growth of single crystals of the high-pressure vertical Bridgman type, wherein insulating cylinder 2 of a shape of an inverted glass with the occluded top is arranged along the inner face of pressure vessel 1 as a furnace casing having a pressure-resistant structure. The pressure vessel 1 is composed of pressure vessel body 3 of a cylindrical shape with the occluded top and bottom closure 4 as the bottom wall covering the lower opening of the container. The bottom closure 4 is mounted on the pressure vessel body 3 in a removable manner and in a sealing fashion with seal ring 5. Then, the insulating cylinder 2 is mounted on the periphery on the bottom closure 4.

Elevating rod 6 vertically passes through the central part of the bottom closure 4 to be then mounted on the part. The elevating rod 6 is arranged with seal ring 7 in a sealing fashion and in a freely elevating manner. On the top of the elevating rod 6 is mounted crucible supporting plate (supporting member) 8, and on the supporting plate 8 is placed and supported crucible 9 at its standing state. The crucible 9 comprises for example p-BN, and the bottom part thereof is provided with small tube part 9a into which seed crystal 10 is inserted. A raw material for single crystal growth is placed on the small tube part 9a.

Then, downwardly extending chamber 11 of an inverted glass shape and comprising a gas-impermeable material, is further arranged along the upper top of the crucible 9 to the upper face of the bottom closure 4 so as to enclose the crucible 9, and heating furnace 12 to heat the crucible 9 through the chamber 11 is arranged in the space between the chamber 11 and the insulating cylinder 2. The chamber 11 comprises a heat-resistant material with gas impermeability, including a metal of a higher melting point such as molybdenum, ceramics, or specified carbon materials such as carbon coated with pyrolytic graphite and glass-like carbon.

The heating furnace 12 is equipped with heater supporting plate 14 fixed with supporting rod 13 onto the bottom closure 4 and heater mounting base 15 fixed onto the heater supporting plate 14. The heater mounting base 15 is in a cage structure wherein four heater mounting plates 16, 16, are vertically linked together at a given interval by means of linking rod 17. These heater mounting plates 16, 16, and the linking rod 17 comprise for example graphite with a satisfactory strength at higher temperatures. On the individual heater mounting plates. 16 are individually fixed heater elements 18, 18 through insulator 19, 19.

Figure 2:
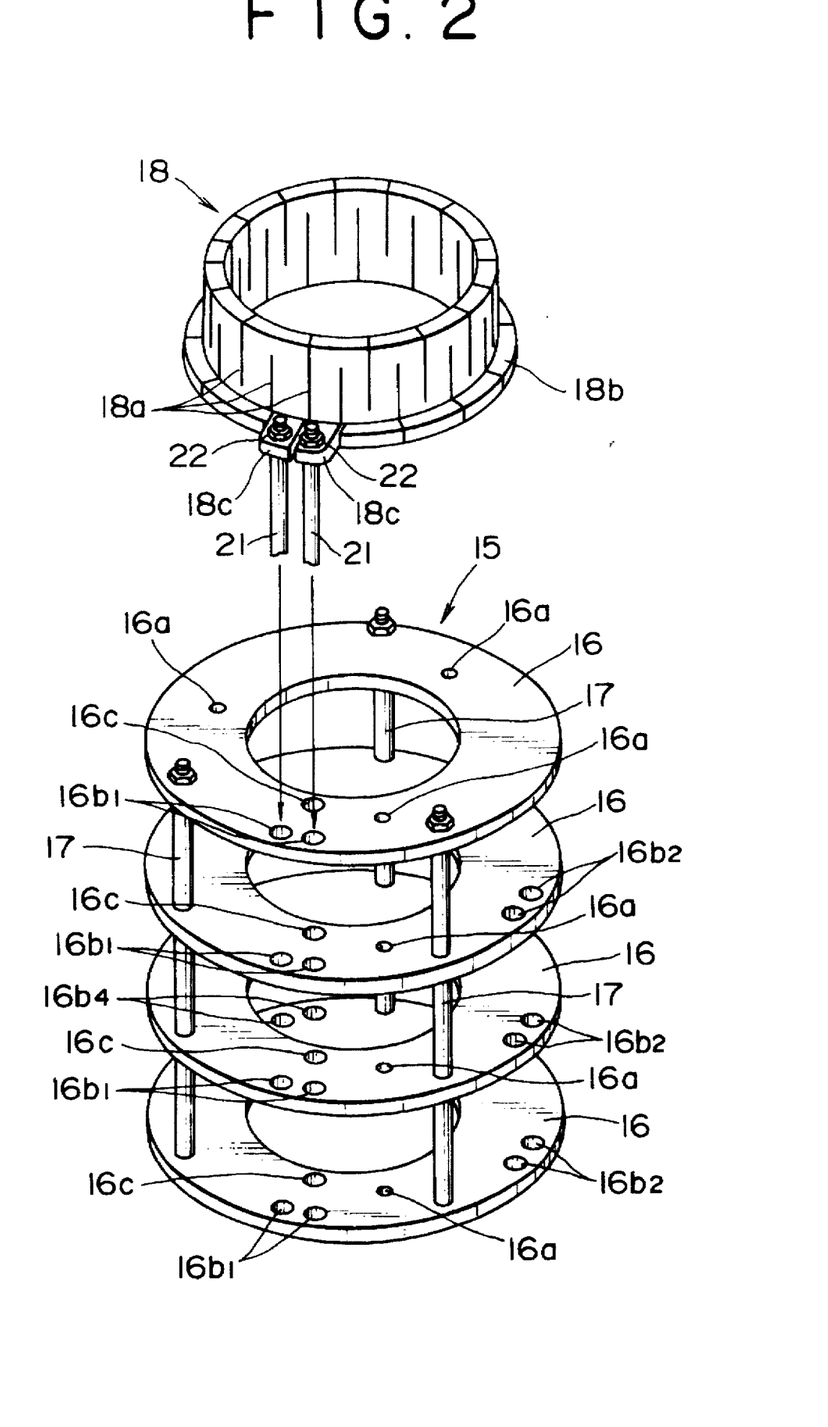
FIG. 2 is a perspective view depicting a heater mounting plate of a heating furnace arranged in the furnace for the growth of single crystals.

FIG. 2 depicts heater element 18 on the uppermost step. The heater element 18 is in an almost cylindrical shape, and slits $18a$, $18a$ in a longitudinal wave are uniformly cut out on the entire cylindrical wall. On the entire periphery of the bottom is formed cleat part $18b$ projecting laterally, and at a given portion of the cleat part $18b$ are further formed a pair of electrode mounting parts $18c$, $18c$ projecting laterally, the electrode mounting parts being adjacent to each other interposing the slit $18a$.

Into the electrode mounting parts $18c$, $18c$ are inserted bar-like lead electrodes 21, 21 made of graphite, for example, from the bottom, and the lead electrodes are fixed with nuts 22,22 made of graphite. By supplying power through the lead electrodes 21,21, electric current flows along the slits $18a$, $18a$ to the cylindrical wall to generate heat. Furthermore, other heater elements 18, 18 are in the same structure as described above.

As shown in the figure, the individual heater mounting plates 16, 16 of the heater mounting base 15 are formed in a ring shape, and the outer diameter is preset to a larger dimension than that of the cleat part $18b$ of the heater element 18, while the inner diameter is preset to a slightly larger dimension than that of the outer diameter of the chamber 11. Then, these heater mounting plates 16, 16 are connected to each other by means of three vertically through type connecting rods 17, 17 outside the cleat part $18b$.

On the heater mounting plate 16 on the uppermost step are formed three heater fixing holes $16a$, $16a$ for fixing heater element 18 from the bottom by means of fixing bolts not shown in the figure, at positions at three equal intervals on the same circumference, when the heater element 18 is to be placed on the heater mounting plate 16. Furthermore, a pair of first lead electrode through type holes $16b_1$, $16b_1$ are formed on a circumference on which are also formed the individual connecting rods 17, 17 on the side of the outer circumference, while through type hole $16c$ of the thermocouple protection tube is formed on the side of the inner circumference.

On the three heater mounting plates 16 below the heater mounting plate 16 at the uppermost step are individually formed heater fixing holes $16a$, $16a$, a pair of fist lead electrode through type holes $16b_1$, $16b_1$, and through type hole $16c$ of the thermocouple protection tube, at positions on the same axis. When the heater element 18 on the uppermost step is fixed to the heater mounting plate 16 in such manner, the lead electrodes 21, 21 with the upper ends being fixed on the heater element 18 structurally pass through the first lead electrode through type holes $16b_1$, $16b_1$ on the heater mounting plates 16, 16, for downward extension.

On the following three heater mounting plates 16, 16 are formed individually a pair of second lead electrode through type holes $16b_2$, $16b_2$, on the same circumferential positions apart from the first lead electrode through type holes $16b_1$, $16b_1$. On the further following two heater mounting plates 16, 16 are additionally formed third electrode through type holes, while fourth electrode through type holes $16b_4$, $16b_4$ are further formed on the heater mounting plate 16 on the lowest step, but these through type holes are not shown in the figure.

As described above, when a heater element not shown in the figure is placed on the second heater mounting plate 16 from the top, a pair of lead electrodes with the upper ends fixed onto the plate pass through the second lead electrode through type holes $16b_2$, $16b_2$ and then extend downwardly, structurally; the lead electrode of the heater element on the third heater mounting plate 16 from the top passes through the third lead electrode through type holes of the two heater mounting plates 16, 16 from the bottom; the lead electrode of the heater element on the heater mounting plate 16 at the lowest step passes through the fourth lead electrode through type holes $16b_4$, $16b_4$ of the heater mounting plate 16 at the lowest step, to individually extend downward.

As shown in FIG. 1, the individual lead electrodes 21 are formed in length and dimension such that the lower end portions thereof pass through insulator 23 engaged in and inserted into the bottom cleat part $14a$ of the heater supporting plate 14, to reach the bottom. On the lower lid 4, alternatively, metal electrode 24 passing through the lid 4 is mounted in the state of being wound with insulating seal ring 25. Then, the upper end part of the metal electrode 24 as a power supply terminal and the lower end part of the lead electrode 21 are connected together through flexible metal lead wire 26. Through the structure, electric power for heating is supplied from outside to the individual heater elements 18, 18.

On the bottom cleat part $14a$ of the heater supporting plate 14 is further fixed the lower end part of thermocouple protecting tube 27. The thermocouple protecting tube 27 is configured such that the tube passes through the thermocouple protecting tube through type holes $16c$, $16c$, formed individually on the individual heater mounting plates 16, 16, and then extends upwardly. Then, four pairs of thermocouples 28 to detect the temperature of the heating zone of each of the heater elements 18, 18 are inserted into the thermocouple protective tube 27. Depending on the temperature detected via these thermocouples 28, the supply capability to the individual heater elements 18, 18 is controlled.

On the aforementioned lower lid 4 is further arranged gas supply and discharge path 31 through which an inactive gas such as argon gas is pressed into pressure vessel 1 and is then discharged from the vessel. On the individual lower end sides of the insulating cylinder 2 and the chamber 11 are individually formed openings 32, 33 in the shape of a through type hole, which independently communicate the inner and outer spaces sectioned with the cylinder and chamber.

So as to generate a temperature distribution where the temperature at a higher elevation in the chamber is higher in the furnace for the growth of single crystals of the structure described above, the supply capability to heater element 18 is adjusted. Thus, by elevating the elevating rod 6 thereby changing the elevated position of the crucible 9 in the chamber 11, the heating temperature can be controlled so as to grow single crystal.

Using the furnace described above to produce the single crystal of ZnSe for example, seed ZnSe crystal 10 of a rod shape is inserted in the small tube part 9a of the crucible 9, followed by charging a small mass of polycrystal ZnSe therein.

Then, opening the bottom closure 4 of the pressure vessel 1 to place the crucible 9 on the crucible supporting plate 8, setting the chamber 11 and the insulating cylinder 2 on the bottom closure 4, the bottom closure 4 is then closed. Thereafter, drawing air out of the pressure vessel 1 into vacuum via the gas supply and discharge path 31 and then supplying argon gas at for example 5 kgf/cm$^2$ into the vessel, the atmosphere inside the vessel is substituted with the gas.

Charging then argon gas of 50 kgf/cm$^2$ into the container and passing heating power in heater elements 18, 18 to initiate heating to prepare the inside of the chamber 11 at a state of a given temperature distribution, thereafter operating the elevating rod 6 to elevate the crucible 9, heating the upper part of the crucible 9 to 1550° C. above the melting point of 1520° C., and heating the lower part thereof to 1510° C. so that the seed crystal 10 remains without melting, the ZnSe raw material is melt inside the crucible 9.

Then, the crucible 9 is drawn down at a descending rate of 3 mm/h over a temperature gradient of 20° C./cm. By such procedures, the single crystal of ZnSe can be grown in the crucible 9.

During such procedures of the single crystal growth, because the insulating cylinder 2 is arranged in the pressure vessel 1 in the furnace described above, the high-pressure gas ascending via spontaneous convection is not in contact with the wall face of the pressure vessel 1, whereby the discharge of heat from the inside of the insulating cylinder 2 is suppressed, whereby spontaneous convection is suppressed. The heater mounting plates 16, 16 of a ring shape, mounting individual heater elements 18, 18 suppress the spontaneous convection between individual heater elements 18, 18; also, the heater mounting plates 16, 16 work as shields of radiation heat from adjacent heater elements 18. Therefore, the temperature controllability of the heating zone via each heater element 18 is improved, whereby the inside of the chamber 14 can be accurately controlled to a desired temperature distribution.

Because the individual heater elements 18, 18 are independently arranged on heater mounting plates 16, 16 supported onto the bottom closure 4, furthermore, heater elements 18 of a larger size can be supported and maintained at a greater stability, so that the growth of a single crystal of a larger crystal size can be attained.

Furthermore, the upper part of the thermocouple protecting tube 27 in the furnace described above passes through each of the individual heater mounting plates 16, 16 to be supported onto the heater mounting plates 16, 16 and thus, the protecting tube 27 can be securely fixed at a given position without any occurrence of deflection on the upper free end of the protecting tube. Therefore, the temperature of each heating zone can be detected appropriately via the thermocouple 28, whereby the vertical temperature distribution can be controlled accurately.

The furnace is also configured such that the upper end of each lead electrode 21 vertically extending inside the insulating cylinder 2 is fixed onto the heater element 18, while the lower end is connected through flexible metal lead wire 26 to metal electrode 24. Therefore, these lead electrodes 21 are mounted structurally at a so-called pending state. Thus, even if the dimension of the lead electrode 21 is changed in the longitudinal direction via the thermal expansion during heating, no power is imposed onto the heater element 18. Consequently, the heater element 18 can be mounted in a stable manner and kept as it is.

Alternatively, during a process of growing crystal comprising heating the raw material to a temperature above the melting point of ZnSe and decreasing the temperature, the dissociation of the raw material gradually progresses intermediately during the temperature elevation. The vapor from the dissociation descends downwardly toward the opening 33 in the chamber 11. Because the opening 33 is arranged on a part apart downwardly from the heating region with the heater element 18 then, the vapor can be deposited on the part by keeping the part at a state of lower temperatures. Because no vapor is in contact with the heating furnace 12 and the like outside the chamber 11, consequently, the incidence of short circuits can be prevented. When the furnace is wholly contaminated with dispersed vapor, additionally, laborious works may be needed for the maintenance such as the decomposition of the inner structures of the furnace and the cleaning thereof. In the furnace, however, such dispersion of the vapor into the whole furnace can be suppressed, whereby the maintenance work gets simpler, thereby improving the production efficiency. Consequently, the furnace can greatly contribute to the industrial production of single crystals of II-VI compounds and those of III-V compounds.

EXAMPLE 2

Another example of the present invention will now be described with reference to FIG. 3. For convenience of description, the same symbol is given to a material having the same function as that of a member in Example 1, for the abbreviation of the description.

Figure 3:
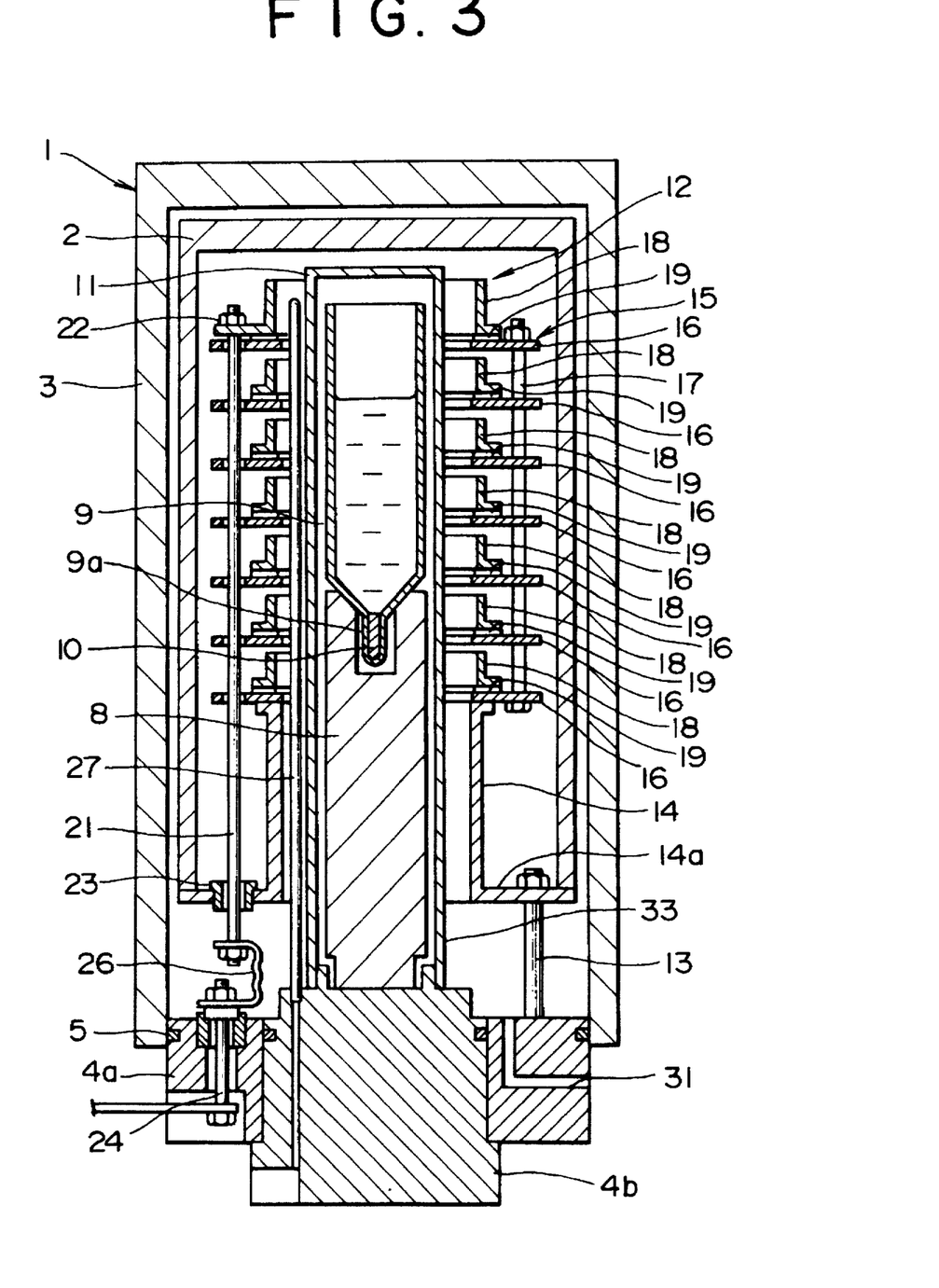
FIG. 3 is a schematic longitudinal view depicting the structure of the furnace for the growth of single crystals of another example of the present invention.

FIG. 3 depicts a furnace for the growth of single crystals according to the vertical temperature gradient freezing method (VGF method) of the present Example. In the furnace, the lower opening of pressure vessel body 3 is covered with two members, namely ring-like bottom closure 4a and inner bottom closure 4b engaged from the bottom so as to occlude the central opening of the ring-like lower lid 4a.

On the ring-like bottom closure 4a is fixed heating furnace 12 of almost the same structure as in Example 1; alternatively, crucible supporting plate 8 for placing crucible 9 is placed on the bottom closure 4a, together with chamber 11 enclosing the plate. Furthermore, thermocouple protective tube 27 is mounted and fixed on the inner bottom closure 4b. For the VGF method, a temperature distribution where the lower part is at lower temperatures and the upper part is at higher temperatures should be maintained when the overall temperature is elevated or lowered. Because more precise temperature control is required, therefore, the heating furnace 12 of the present Example is equipped with Seven heater elements 18, 18 so that the heating furnace 12 comprises seven zones, which number is larger than that of the present Example 1.

In the structure, by drawing only the inner bottom closure 4b downwardly when the crucible 9 charged with a raw material is placed in the furnace so as to draw out the single crystal after the production or so as to exchange a thermocouple, the chamber 11 and the like can be removed so that the furnace can be in operation while the heating furnace 12 and the like on the ring-like bottom closure 4a remain in the pressure vessel 1, except for the time of maintenance works. Thus, the operability improves greatly.

EXAMPLE 3

Still another example of the present invention will now be described with references to FIGS. 4(a) and 4(b). For convenience of description, the same symbol is given to a member having the same function as that of a member in the Example 1 for the abbreviation of the description.

Figure 4A:
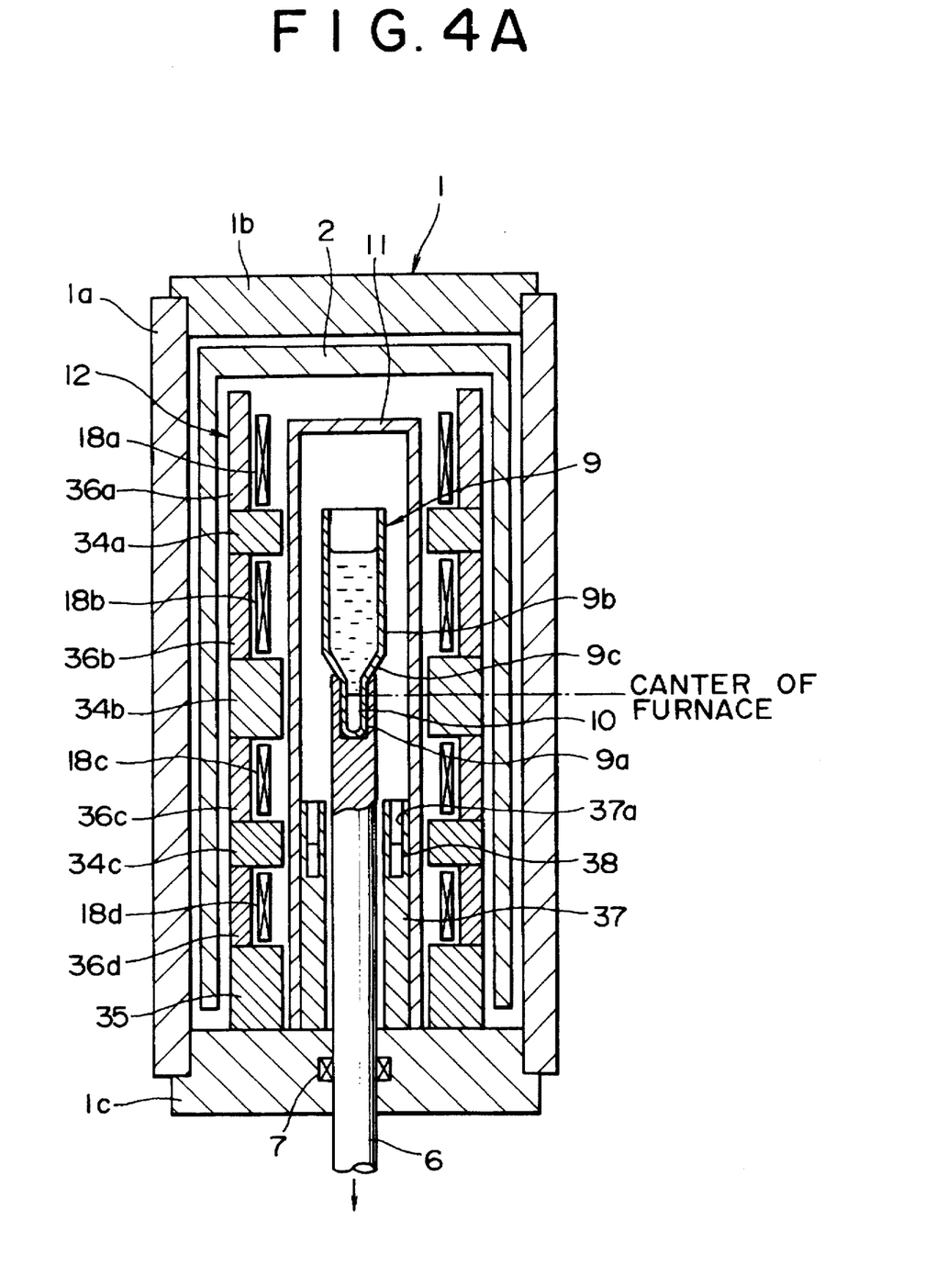
FIG. 4(a) is a schematic longitudinal view depicting a heating process furnace configured as a furnace for the growth of single crystals of still another example of the present invention.

FIG. 4(a) is a schematic view depicting the furnace for the growth of single crystals by the vertical Bridgman method (VB method) in accordance with the present invention. The pressure vessel 1 of the furnace comprises cylindrical container body 1a, upper closure 1b occluding the upper opening, and bottom closure 1c arranged in the lower opening in a removable fashion and in a sealing manner.

The present Example is markedly different in that the intervals between a pair of heating elements 18, 18 of the heating furnace vary depending on the pair and in that insulating materials 34a to 34d are arranged between a pair of heating elements 18, 18 so as to improve independent temperature controllability in each zone.

As described above, more specifically, the heating furnace 12 is equipped for example with four cylindrical heater elements 18a to 18d in the vertical direction and ring-like insulating materials 34a to 34c between a pair of these individual heater elements (referred to as "first heater element 18a, second heater element 18b, third heater element 18c and fourth heater element 18d" hereinbelow), while lower insulating material 35 is placed between the fourth heater element 18d and the bottom closure 1c. Furthermore, individually cylindrical outer insulating materials 36a to 36d are arranged so as to cover the outer areas of the individual heater elements 18a to 18d.

Individual interheater insulating materials 34a to 34c vertically sectioning the individual heater elements 18a to 18d are in a form such that the inner circumferential face of the insulating materials might be as close as possible to the outer circumferential face of the chamber 11, so that the insulating materials might project more inwardly in the diameter direction, compared with the individual heater elements 18a to 18d. Also, the thickness in the vertical direction should be formed to match the interval between any pair of the individual heater elements 18a to 18d, so that the individual upper and lower faces might be as close as possible to the upper and lower ends of the individual heater elements 18a to 18d.

Among these three interheater insulating materials 34a to 34c, then, the central interheater insulating material (referred to as "specified interheater insulating material" hereinbelow) 34b is in the structure to be positioned at an approximately central elevation inside the pressure vessel 1, while the insulating material 34b is formed at a thickness larger than those of the upper and below interheater insulating materials 34a, 34c.

Figure 4B:
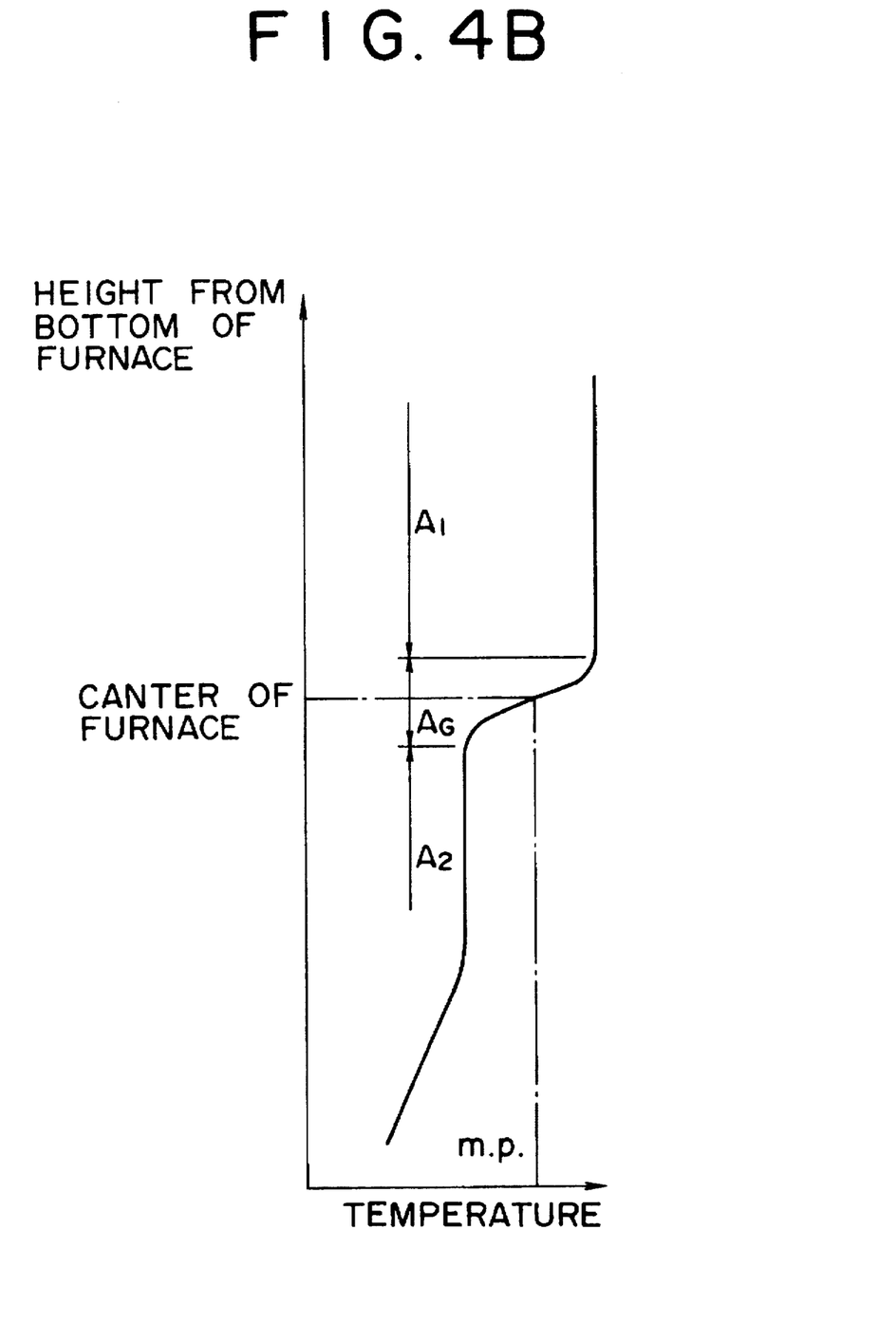
FIG. 4(b) is a graph depicting the temperature distribution in the furnace shown in FIG. 4(a) during the process of growing single crystal.

As shown in FIG. 4(b), more specifically, the process of growing single crystal described below is carried out while forming a temperature distribution having a sharp temperature gradient $A_G$ at an approximate center of the distribution in the longitudinal direction. In the upper part above the sharp temperature gradient region $A_G$ is formed approximately constant temperature region $A_1$ higher than the melting point of the single crystal in growth, while in the lower part is formed approximately constant temperature region $A_2$ which is preset for heating reservoir 37. When the uppermost interheater insulating material 34a and the third interheater insulating material 34c, correspondingly located at these regions $A_1$ and $A_2$, respectively, get a larger thickness, the temperature between the heaters may eventually fall so that the approximately constant temperature regions $A_1$ and $A_2$ described above cannot be secured. Thus, after narrowing the interval between the first and second heater elements 18a and 18b and the interval between the third and fourth heater elements 18c and 18d, the thickness of these insulating materials should be determined, depending on the interval.

Alternatively, the thickness of the specified interheater insulating material 34b at an elevation position corresponding to the sharp temperature gradient region $A_G$ is preset approximately corresponding to the dimension of the region $A_G$ in the vertical direction, and thus, the insulating material 34b is formed with a thickness larger than that of the remaining interheater insulating materials 34a, 34c described above.

The lower insulating material 35 is in a form such that the inner circumferential face thereof should be as close as possible to the outer circumferential face of the chamber 11. Also, the upper face is in a form such that the upper face is adjusted to the space between the fourth heater element 18d and the bottom closure 1c. On contrast, the individual outer insulating materials 36a to 36d are in a form such that the inner circumferential faces might be as close as possible to the outer circumferential faces of the individual heater elements 18a to 18d.

As the insulating materials described above, namely 34a to 34c, 35 and 36a to 36d, the most suitable material should be selected appropriately from the following group, depending on the atmospheric gas in the furnace and the temperature when the furnace is used; and the group consists of ceramic materials such as BN, SiC, $Si_3N_4$, AlN, $Al_2O_3$, $SiO_2$, and $ZrO_2$ or carbon materials. As described below, for example, the material $Al_2O_3$ (alumina) is suitable when the furnace is to be used in an inactive gas such as argon at a temperature region of about 1200° C.

The method for arranging the interheater insulating materials 34a to 34c comprises arranging a ceramic material on the upper or lower face of the heater mounting plate of Examples 1 and 2, or forming the heater mounting plate of itself from the ceramic material or carbon material, whereby the interheater insulating materials are appropriately arranged.

In the present Example, furthermore, reservoir 37 of a tube shape of a larger thickness is arranged on the lower part inside the chamber 11, and the reservoir 37 is equipped with a center hole through which the elevating rod 6 passes. In the reservoir 37 is formed ring-like groove 37a which subsides from the upper face thereof downwardly, and element 38 of higher dissociation pressure is to be placed inside the ring-like groove 37a.

Then, the procedures for growing a single crystal of GaAs by means of the furnace will be described.

Firstly, charging seed crystal 10 composed of a rod-like GaAs single crystal in the small tube part 9a of the crucible 9, GaAs polycrystal (about 6 kg) as the raw material for growing the single crystal was charged thereon. Alternatively, an appropriate amount of GaAs was charged as element 38 of high dissociation pressure inside the reservoir 37. Placing then the crucible 9, the reservoir 37, and molybdenum-made chamber 11 inside the pressure vessel 1 as shown in the figure, sealing the pressure vessel 1, repeating air discharge from the inside of the pressure vessel 1 so as to prepare the inside into vacuum as well as the inner substitution with argon gas through a gas supply and discharge path, argon gas is filled into the vessel 1 at a pressure state of about 2 kgf/cm$^2$.

Then, the elevating rod 6 is retained at the upper limit position within the range of vertical motion, whereby crucible 9 is retained in such a manner that the upper part of the small tube part 9a is positioned at an almost central height of the specified interheater insulating material 34b, as shown in FIG. 4(a).

Thereafter, initiating to pass electric current in the individual heater elements 18a to 18d, and elevating the temperature while keeping the chamber 11 at such a temperature distribution state that the temperature is higher at a higher location, the supply capability to the individual heater elements 18a to 18d was regulated to finally form and maintain the temperature distribution of FIG. 4(b) inside the chamber 11. The temperature distribution above is such that the temperature at an almost central height of the specified interheater insulating material 34b is the melting point of GaAs (1283° C.), and that a sharp temperature gradient region A$_G$ of a temperature gradient of almost 20° C./cm is located approximately at the center of the melting point region.

By forming such temperature distribution and thereafter carrying out heating, the raw material inside the crucible 9 is melt while the seed crystal 10 on the bottom part remains as it is, to form a melt solution of the raw material on the seed crystal 10.

By forming a temperature region A$_Z$ of about 618° C. below the sharp temperature gradient region A$_G$, the element 38 of high-pressure dissociation in the reservoir 37 is heated at that temperature, whereby As vapor at about 1 atom corresponding to the As equilibrium pressure at the melting point of GaAs, is generated from the reservoir 37. Then, the As vapor fills the inside of the chamber 11.

At such state, the elevating rod 6 is made to gradually descend at a rate of about 1 mm/h, whereby the melt solution of the raw material inside the crucible 9 passes sequentially through the lower part and through the temperature region of the melting point to be transferred to a low-temperature side, involving the solidification starting the lower part in contact to the seed crystal 10 to grow a single crystal.

During the procedures of growing single crystal, the present furnace has acquired a remarkably improved temperature distribution near the melting point, compared with those of conventional furnaces. The control of the temperature gradient in the interface of growth, in particular, has had a deflection of ±1° to 2° C. in conventional furnaces, but the deflection is within ±0.1° C. in the present furnace. The output of the individual heater elements 18a to 18d is stable, with no deflection conventionally observed.

After solidifying the whole melt solution of the raw material in the crucible 9 to terminate the single crystal growth, the electric current to the individual heater elements 18a to 18d is switched off, and at the time when the temperature inside the furnace reaches about 300° C., then, the procedure of discharging argon gas inside the high-pressure container 1 out of the furnace is carried out; when the temperature is decreased down nearly to room temperature, the lower lid 1c is moved downward to open the high-pressure container 1, the crucible 9 is drawn out to recover the grown crystal out of the crucible.

By the above procedures, GaAs single crystal of a length of about 250 mm was recovered, which was produced under stable controls of the temperature distribution during the growth of single crystal. Thus, the quality of the resulting single crystal was excellent with less crystal defects.

In the present Example as has been described above, the arrangement of interheater insulating materials 34a to 34c, lower part insulating material 35 and outer insulating materials 36a to 36d on the periphery of the individual heater elements 18a to 18d stabilizes the temperature distribution during single crystal growth, whereby a high-quality single crystal can be produced.

More specifically, because the individual heater elements 18a to 18d are sectioned from each other by means of interheater insulating materials 34a to 34c, thereby suppressing the thermal radiation between the heater elements and interaction via gas convection, and because the space between the heater elements in the sectioned regions and the space between the heater elements and the insulating cylinder 2 are formed into a dimension as small as possible, the effect of gas convection in the sectioned regions of the individual heater elements 18a to 18d and in the whole furnace can be suppressed. Consequently, the independence of the controllability of the individual heater elements 18a to 18d can be improved, whereby the temperature deflection can remarkably be suppressed.

So as to grow single crystal as described above, in particular, a sharper temperature gradient region A$_G$ should be formed near the melting point than conventional temperature gradients. In other words, a sharper temperature gradient near the melting point decreases more the deflection of the growing interface against the temperature deflection (fluctuation). When a temperature deflection of 0.5° C. occurs for example, the deflection of the growing interface is only 0.025 cm at a temperature gradient of 20° C./cm; at a temperature gradient of 1° C./cm, alternatively, the deflection of the growing interface reaches 0.5 cm.

By forming a sharp temperature gradient near the melting point, thus, the re-melting and re-solidification of the crystal in growth can be suppressed. Consequently, a high-quality single crystal with reduced crystal defects including dislocation or twin is generated.

As has been described above, the aforementioned heating furnace 12 has attained the improvement in the independence of the controllability of each heater element to suppress the temperature fluctuation, where a single crystal is grown at a state with a stabilized sharp temperature gradient region A$_G$, to consequently suppress the deflection of the growing interface as less as possible, whereby a high-quality single crystal can be generated, with less crystal defects such as a lower dislocation density and the occurrence of twin.

Seeding can be carried out securely also by means of the furnace, to produce a high-quality single crystal at a higher reproducibility.

EXAMPLE 4

Description will now be made of an example using the heating process furnace in accordance with the present invention, with references of FIGS. 5(a) and 5(b). For convenience of description, the same symbol is given to a member having the same function as that of a member in the Example 3 so as to abbreviate the description.

Figure 5A:
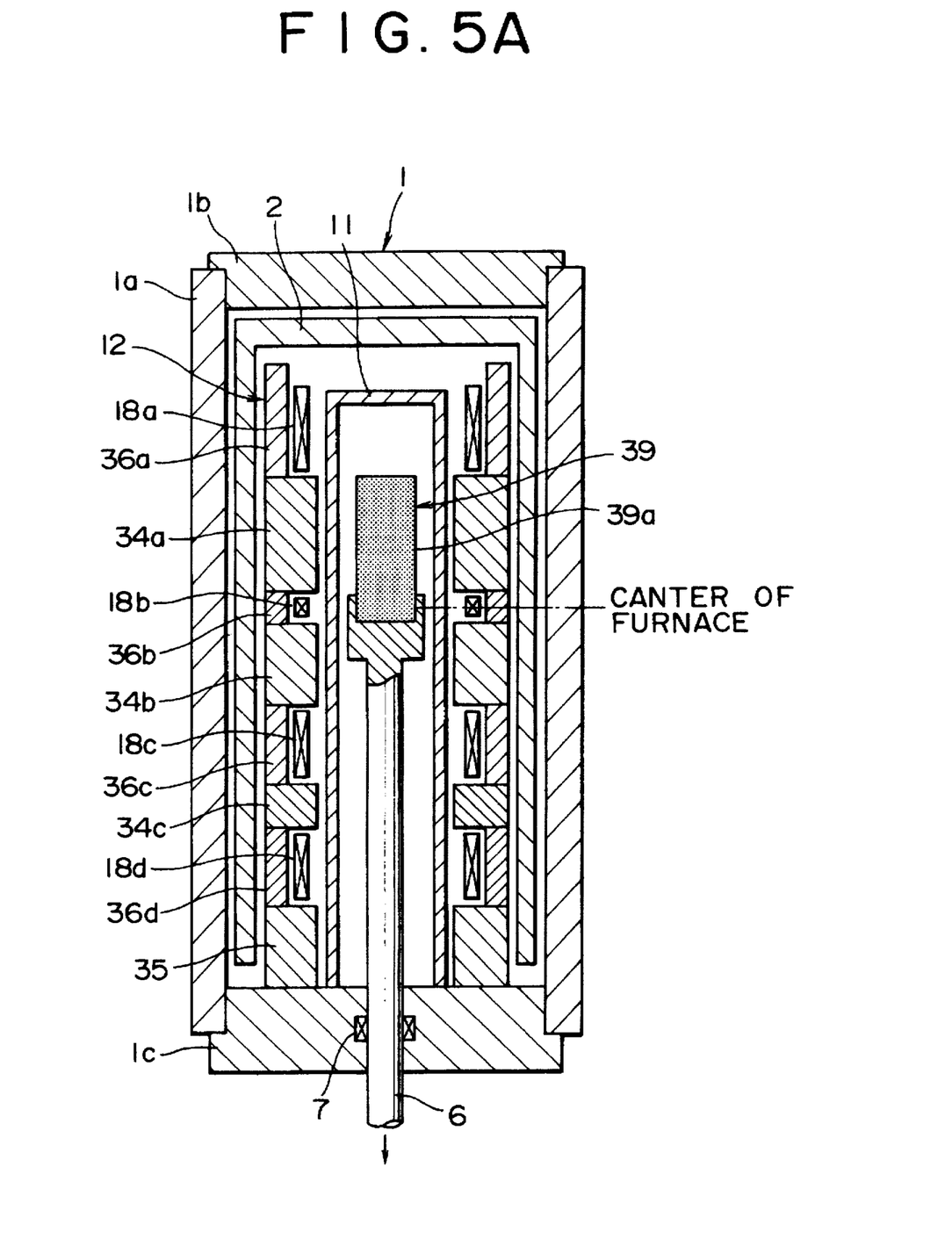
FIG. 5(a) is a schematic longitudinal view depicting the heating process furnace configured as a ceramic sintering furnace of another example of the present invention.

FIG. 5(a) depicts a heating process furnace configured as a ceramic sintering furnace. The furnace comprises heating furnace 12 equipped with four heater elements 18a to 18d on the periphery of the chamber 11, as described above. By the heating furnace 12, a temperature distribution with a top is formed, as shown in FIG. 5(b); in other words, a sintering temperature region $B_S$ above the sintering temperature is formed within a narrow region at an approximately central position inside the high-pressure container 1 along the height direction, and a temperature distribution with individual sharp temperature gradient regions $B_G$, $B_G$ is formed above and below the sintering temperature region $B_S$.

Thus, second heater element 18b arranged on the position of a height corresponding to the sintering temperature region $B_S$ is formed into a shape with a shorter axial length as shown in FIG. 5(a), and individual interheater insulating materials 34a, 34b interposing the second heater element 18b from the top and bottom are arranged on positions of heights corresponding to the individual sharp temperature gradient regions $B_G$, $B_G$; these insulating materials 34a, 34b are formed in a thickness larger than that of the lower interheater insulating material 34c. On the upper face of the elevating rod 6 passing through the lower lid 1c is retained a processing material as a heating substance, for example a preliminarily sintered material of ceramic such as $Si_3N_4$.

Figure 5B:
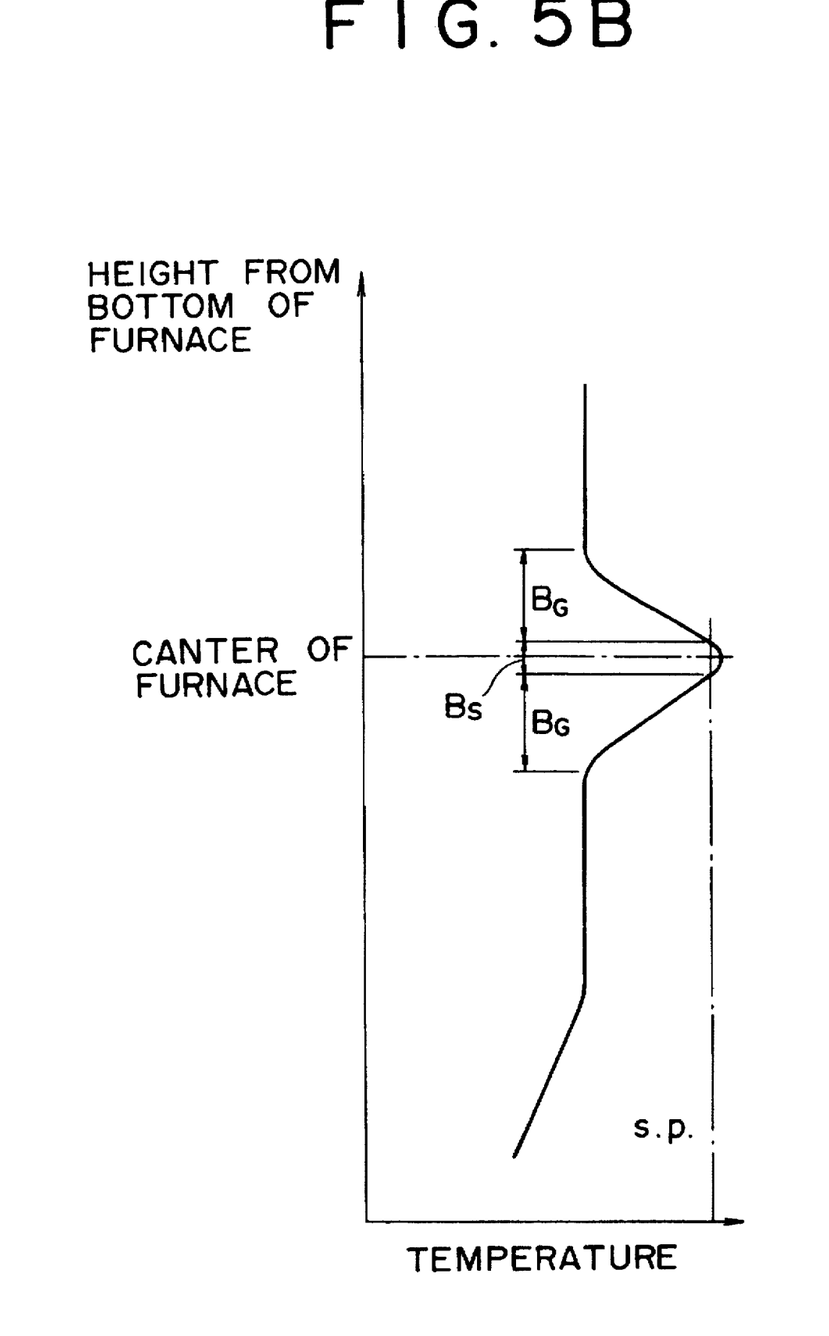
FIG. 5(b) is a graph depicting the temperature distribution in the furnace shown in FIG. 5(a) during sintering.

For sintering $Si_3N_4$ by means of the furnace, retaining the heating substance 39 on the elevating rod 6 thereby sealing the high-pressure container 1, the supply capability to the individual heater elements 18a to 18d is controlled so as to form the temperature distribution of FIG. 5(b) in the chamber 11. So as to position the lower end of the heating substance 39 above the sintering temperature region $B_S$, then, the heating substance 39 is to be retained while the elevating rod 6 is to be positioned at the upper limit position thereof. For sintering of $Si_3N_4$, $N_2$ gas and argon gas, for example, are independently charged at given high pressures inside the chamber 11 and outside the chamber 11, respectively, whereby such an atmospheric state is prepared in the high-pressure chamber 11 that the decomposition of $Si_3N_4$ can be suppressed, along with simultaneous suppression of the deterioration of the heater and the like.

When the temperature distribution as described above is attained, the elevating rod 6 descends at a given rate, whereby the processing substance 39 successively passes through the sintering temperature region $B_S$ starting the lower bottom thereof and then through the temperature region $B_S$, whereby the non-sintered part 39a is successively sintered starting the lower bottom thereof.

So as to precisely control the sintered part by such procedure, preferably, the sintering temperature region $B_S$ should be narrowed; and the temperature gradient on both the sides of the region should be as sharp as possible. Such temperature gradient can be generated in a stable manner by means of the heating furnace 12 described above.

The present invention is not limited to the above Examples, but various modifications may be possible within the scope of the present invention. For example, Examples 1 and 2 may be configured such that heater mounting base 15 may be configured with rods arranged at various angles in a zigzag form if the number of graphite lead electrodes 21 may be increased as the zone number is further increased. Also, an example of heater mounting plate 16 made of graphite is shown, but the plate may be formed of an insulating ceramics such as BN (boron nitride). In such case, insulator 19 is not needed.

In Example 3, one embodiment is shown where the present invention is applied to a single crystal production furnace according to the vertical Bridgman method (VB method), but the present invention is also applicable to the structuring of furnaces according to other methods such as horizontal Bridgman method (HB method).

In Example 4, one embodiment is shown where the processing substance 39 is successively sintered starting the lower bottom thereof after the substance once descends, but it is possible to successively sinter the processing substance 39 starting the upper part thereof after the substance once ascends. Because a heating region at higher temperatures and a heating region at lower temperatures may be formed closely to each other in a single furnace in a stable fashion by arranging a sharp temperature gradient, the processing substance 39 can be transferred from a high-temperature portion to a low-temperature portion for a short period, whereby the furnace can be structured which can give a rapid cooling effect to the processing substance.

What is claimed is:

1. A vertical furnace for the growth of single crystals comprising;

a sealed furnace casing having a gas supply and discharge path to be connected outwardly;

a supporting member supporting a raw material charging container to charge the raw material for the growth of single crystals in the furnace casing;

approximately cylindrical heater elements being vertically arranged in parallel in the furnace casing and for heating the periphery of the raw material charging container;

an insulating cylinder of an approximately inverted glass shape to enclose the entirety of the individual heater elements from the tops being arranged in the furnace casing;

heater mounting plates in a ring shape, being arranged in parallel at a given interval in a vertically separated space in which heater elements are arranged in the insulating cylinder, and on the individual heater mounting plates the heater elements are mounted; and lead electrodes vertically hanging from the outer periphery of the individual heater elements in the insulating cylinder, being independently connected to the power supply terminals mounted on the bottom wall of the furnace casing.

2. A vertical furnace for the growth of single crystals according to claim 1, further comprising;

a thermocouple for detecting the heating temperature by means of the individual heater elements, and a protecting tube for the thermocouple, wherein the protecting tube vertically passes through the inner portion of the individual heater elements on the heater mounting plates to be supported thereon.

3. A vertical furnace for the growth of single crystals according to claim 1, further comprising;

a chamber comprising a airtight material, which enclose a raw material charging container inside the individual heater elements and the heater mounting plates, wherein an opening communicating the inside and outside of the chamber together is arranged on the bottom of the chamber.

4. A vertical furnace for the growth of single crystals according to claim 3, further comprising;

an insulating material interposed between a pair of the heater elements, wherein the insulating material extends through an adjacent heater element to a position close to the outer face of the chamber, and wherein a specified insulating material is prepared to a thickness larger than the thickness of the insulating materials capable of nearly filling up the space between a pair of the heater elements, thereby placing a sharp temperature gradient region with a locally sharper temperature gradient in the furnace.

5. A vertical furnace for the growth of single crystals according to claim 4, wherein the insulating material comprises a ceramic material such as BN, SiC, $Si_3N_4$, AlN, $Al_2O_3$, $SiO_2$, and $ZrO_2$ or a carbon material.

6. A vertical furnace for the growth of single crystals according to claim 5, further comprising;

a reservoir for generating the vapor of an element of higher dissociation pressure during crystal growth thereby maintaining the inside of the chamber at a given vapor pressure, the element being a composition element of a raw material for single crystal growth for use in the single-crystal production furnace, the raw material being selected from a III-V compounds and II-VI compounds.

7. A vertical furnace for the growth of single crystals according to claim 1, wherein the upper ends of the individual lead electrodes are fixed on the heater elements, and the lower ends thereof are independently connected through a flexible metal lead wire to the terminals for power supply.

8. A vertical furnace for the growth of single crystals according to claim 1, wherein the sealed furnace casing comprises a pressure vessel and a bottom closure covering the bottom part of the pressure vessel, the bottom closure comprising a ring-like bottom closure having an opening at the center and an inner bottom closure engaged and inserted from the bottom so as to occlude the central opening of the ring-like bottom closure.

9. A vertical furnace for the growth of single crystals according to claim 1, further comprising;

an insulating material arranged on the face of each of the heater mounting plates so as to improve the independence of the temperature controllability of the space sectioned with the heater mounting plates.

10. A vertical furnace for the growth of single crystals according to claim 1, wherein the heater mounting plates comprise an insulating ceramic.

11. A vertical furnace for the growth of single crystals comprising:

a sealed furnace casing;

a chamber comprising an airtight material, being arranged in the furnace casing;

a raw material charging container for charging the heating substance in the chamber, wherein the heating substance is a raw material for the growth of a single crystal of a compound, and the melt solution of the raw material, generated by heating, is solidified starting the side in contact to the seed crystal, thereby growing the melt solution into a single crystal;

approximately cylindrical heater elements being vertically arranged in parallel in the furnace casing and being arranged on the outer face of the chamber, wherein the power supply to the heater elements is adjusted to form a given temperature distribution in the chamber; and an insulating material interposed between a pair of the heater elements, wherein the insulating materials extends through an adjacent heater elements to a position close to the outer face of the chamber; and wherein a specified insulating materials is prepared to a thickness larger than the thickness of the insulating materials capable of nearly filling up the space between a pair of the heater elements, thereby placing a sharp temperature gradient region with a locally sharper temperature gradient in the furnace.

12. A vertical furnace for the growth of single crystals according to claim 11, further comprising:

a transfer means to transfer the raw material charging container in the chamber.

13. A vertical furnace for the growth of single crystals according to claim 12, wherein the sharp temperature gradient is arranged in a temperature region including the melting point of the single crystal.

14. A vertical furnace for the growth of single crystals according to claim 11, further comprising:

an outer insulating material arranged so as to enclose the outer faces of the individual heater elements, while the inner circumferential face of the outer insulating material is arranged in proximity to the outer circumferential faces of the heater elements.

15. A vertical furnace for the growth of single crystals according to claim 14, further comprising:

a lower insulating materials arranged between the bottom of the furnace casing and the lowest heater element among the individual heater elements, wherein the inner circumferential face of the lower insulating material is arranged in proximity to the outer circumferential face of the chamber.

* * * * *